United States Patent
Alakuijala et al.

(10) Patent No.: US 8,653,992 B1
(45) Date of Patent: Feb. 18, 2014

(54) DATA COMPRESSION OPTIMIZATION

(75) Inventors: Jyrki Antero Alakuijala, Zurich (CH); Lode Vandevenne, Zurich (CH)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/525,340

(22) Filed: Jun. 17, 2012

(51) Int. Cl.
*H03M 7/34* (2006.01)

(52) U.S. Cl.
USPC .................. 341/51; 341/50; 341/65

(58) Field of Classification Search
USPC ............................... 341/50, 51, 65
See application file for complete search history.

(56) References Cited

U.S. PATENT DOCUMENTS 6,411,227 B1 * 6/2002 Fish .................... 341/65
2003/0030575 A1 * 2/2003 Frachtenberg et al. ....... 341/51

* cited by examiner

*Primary Examiner* — Jean B Jeanglaude
(74) *Attorney, Agent, or Firm* — Morris & Kamlay LLP

(57) ABSTRACT

Systems and methods for optimizing the compression of data using a dictionary coding compression system are described. A system performs an initial compression operation, such as by using a dictionary or other coder. The system then refines the compression by performing an iterative backward reference search for an optimized compressed file.

18 Claims, 5 Drawing Sheets

DATA COMPRESSION OPTIMIZATION

FIELD

Embodiments relate generally to data compression, and, more particularly, to optimizing data compression.

BACKGROUND

Dictionary coding data compression techniques, such as LZ77, may compress data in a single pass. In performing the compression, a compression system can generate dictionary entries and literals. At each step in the compression process, the system executing a conventional compression algorithm may make a selection of a dictionary entry or literal to compress a given section of input data and then move to compress a next section of input data.

SUMMARY

One embodiment includes a method for optimizing data compression. The method can include performing a compression operation on a data file using a computer system having an LZ77 compressor and Huffman coded entries and literals. The system can pre-compute and store intermediate results (e.g., all possible backward references) of the compression operation in memory in order to help speed up the search for an optimized compression by avoiding the need to compute the backward references during each iteration of the optimization process. The system can select a hashing technique for accessing the stored intermediate results. The hashing technique can be selected based on one or more features of the intermediate results.

The system can iteratively refine the compression operation via backward reference of the stored intermediate results of the compression operation. The refining can include accessing stored intermediate results using the selected hashing technique and selecting one or more entries and literals associated with an increased compression based on a cost model having bit cost estimates (i.e., selecting a candidate shortest path based on bit cost estimates from the cost model). The bit cost estimates in the cost model can be represented as floating point numbers, fixed point number or fractional bit numbers.

The method can include stopping the refining when a termination condition is reached, the termination condition including one or more of performing a predefined number of iterations, selecting a candidate shortest path having a higher actual total bit cost than a current shortest path (i.e., the iteration has produced a candidate path that is not as optimized as the path from the previous iteration), and/or reaching a steady state of actual total bit costs for paths.

One embodiment includes a method for optimizing data compression. The method can include performing a compression operation on a data file using a dictionary coder and iteratively refining the compression operation via backward reference of stored intermediate results of the compression operation. The refining can be based on updating cost model values and selecting a shortest path candidate based on the cost model. The updating of the cost model can include averaging cost estimates across iterations. The method can include stopping the refining when a termination condition is reached.

One embodiment can include a data compression optimization system. The system can include a processor coupled to a computer readable storage medium, the computer readable storage medium having stored therein software instructions that, when executed by the processor, cause the processor to perform operations. The operations can include performing a compression operation on a data file using a dictionary coder, and iteratively refining the compression operation via backward reference of stored intermediate results of the compression operation based on the cost model. The operations can include stopping the refining when a termination condition is reached.

The dictionary coder can include an LZ77 compressor having entropy coded entries and literals. The method (or operations) can include selecting a hashing technique for accessing the intermediate results based on one or more features of the intermediate results. The method (or operations) can also include selecting a hashing technique for accessing the stored intermediate results based on one or more features of the stored intermediate results.

The refining can include accessing stored intermediate results using the selected hashing technique and selecting one or more entries and literals associated with an increased compression based on bit cost estimates retrieved from a cost model. The refining can also include selecting one or more entries and literals associated with an increased compression based on a shortest path candidate selected based on cost estimates from the cost model, where the actual total cost of the shortest path candidate can be computed to determine if the candidate shortest path actually represents an improvement in compression over a previous iteration.

The termination condition can include one or more of performing a predefined number of iterations, selecting a candidate shortest path having a higher actual total bit cost than a current shortest path (i.e., the iteration has produced a candidate path that is not as optimized as the path from the previous iteration), and/or reaching a steady state of actual total bit costs for paths being selected. The refining can include selecting one or more entries and literals for a shortest path candidate associated with a potential increased compression based bit cost estimates retrieved from a cost model, wherein bit cost estimates can be represented as floating point numbers, fixed point numbers or fractional bit numbers.

DETAILED DESCRIPTION

A method for optimizing the compression of data using a dictionary coding compression system is described. A system can perform an initial compression operation and then refine the compression by performing an iterative backward reference search for an optimized compressed file.

In one embodiment, the system can perform the initial compression operation on a data file using a dictionary coder having entropy coded entries and literals. The dictionary coder can perform the compression operation using a compression technique such as LZ77. The entries and literals in the dictionary can be entropy coded using Huffman coding, for example.

Once the initial compression is complete, the system iteratively refines the compression operation by performing a backward reference search on the stored intermediate results of the compression operation. During the backward reference search, the system selects a candidate shortest path having one or more parameters (e.g., entries and/or literals) that potentially optimize the compression based bit cost estimates retrieved from a cost model. The bit cost estimates (and averages of those estimates) can be represented by floating point numbers, fixed point numbers or fractional bit numbers.

In one embodiment, the system can cache the intermediate results to speed up access time during the refining process. The system can use a hashing technique to access the stored results in cache memory. For further optimization, the hashing technique can be selected from a plurality of hashing techniques based on one or more features of the stored intermediate results.

The system can stop the iterative refining when a termination condition is reached. The termination condition can include one or more of performing a predefined number of iterations, selecting a candidate shortest path having a higher actual total bit cost than a current shortest path (i.e., the iteration has produced a candidate path that is not as optimized as the path from the previous iteration), and/or reaching a steady state of actual total bit costs for paths being selected.

Figure 1:
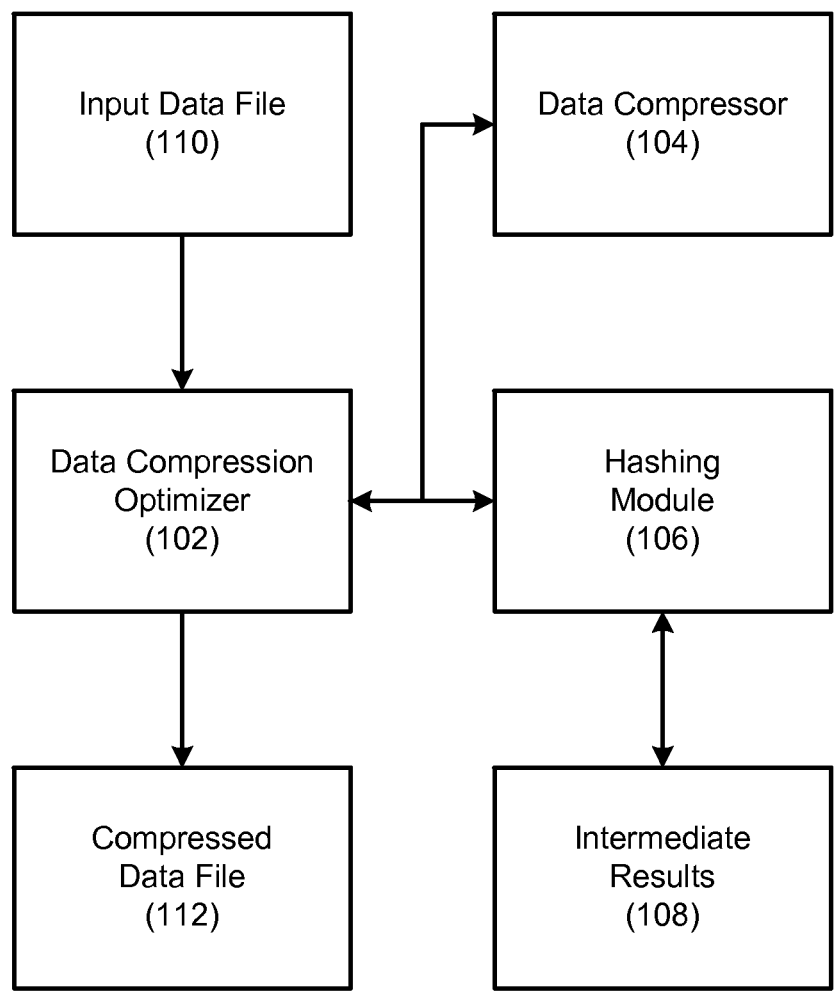
FIG. 1 is a diagram of an example data compression optimization system in accordance with at least one embodiment.

As shown in FIG. 1, a data compression optimization system 100 includes a data compression optimizer 102, a data compressor 104, a hashing module 106, intermediate results 108, an input data file 110 and an output compressed data file 112.

In operation, the data compression optimizer 102 receives an input data file 110 to be compressed. The data compression optimizer 102 performs an initial compression of the input data file 110 using the data compressor 104. The initial compression establishes a baseline level of compression and can also generate intermediate compression results (e.g., dictionary and literals) that can be stored in the intermediate results 108.

Once the initial compression is complete, the data compression optimizer 102 performs an iterative refining process to obtain an optimized (e.g., smallest) compressed file and then outputs that as the compressed data file 112. The data compression optimizer 102 can serve as the controlling process or module in a data compression optimization system.

The data compressor 104 can include, but is not limited to, LZ77 or LZ78. In general, the systems and methods described herein can be used with any dictionary coder.

The hashing module 106 can include one or more hashing techniques such as LZ77/flat-style hashing, run length encoding (RLE) based hashing and variable length hashing. A particular hashing technique can be selected during the data compression optimization based on characteristics of the data (e.g., intermediate results). For example, if input data to be compressed includes text data then variable length hashing may be chosen as a hashing technique suitable for use with text data.

Figure 2:
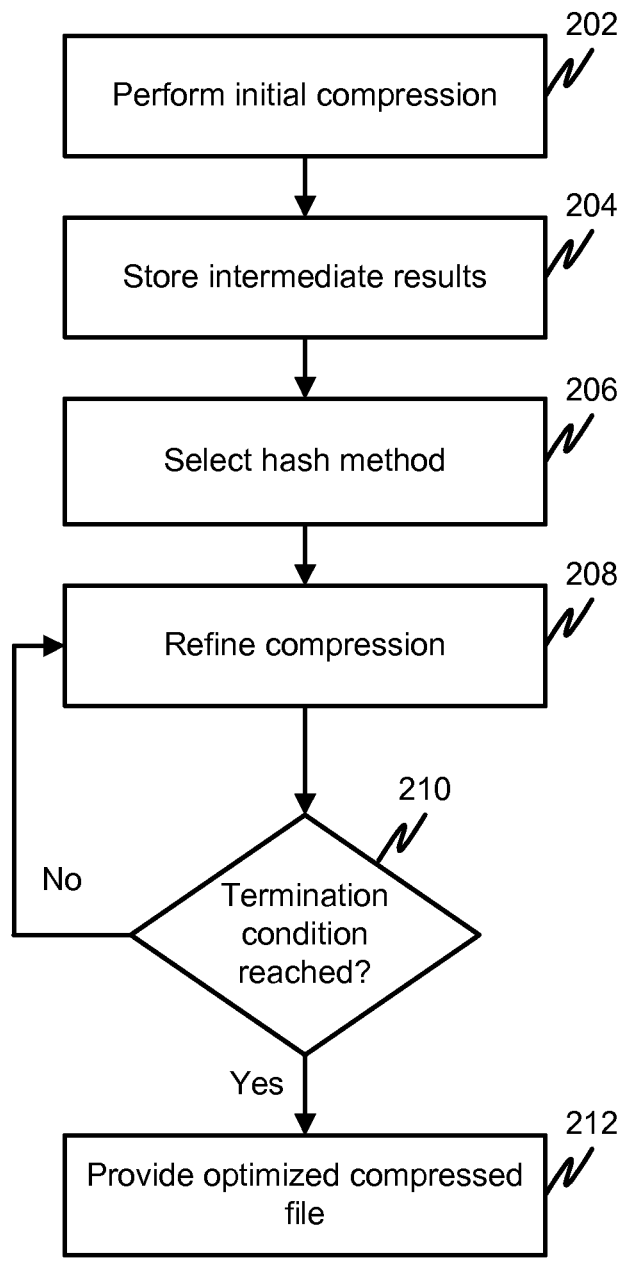
FIG. 2 is a flow chart of an example method for data compression optimization in accordance with at least one embodiment.

FIG. 2 is a flow chart of an example method for data compression optimization. Processing begins at 202, where a system performs an initial compression on an input data file (or data block). For example, an input data stream may be divided into data blocks (e.g., 32K bytes, 64K bytes or the like) and compression is performed on a data block. At 204, intermediate results of the compression are stored in memory. The intermediate results can be pre-computed and stored in memory to help speed up the data compression optimization.

At 206, a hashing method is selected based on characteristics of the intermediate results. For example, the hashing method can include, but is not limited to, LZ77 (or flat style) hashing, run length encoding (RLE) hashing and variable length hashing. The initial default hash technique can be LZ77. Then, if it is determined, based on the data, that an RLE hashing technique would be effective, the hashing technique can be changed during data compression optimizing.

At 208, the system iteratively refines the initial compression. The iterative refining can include a backward reference search through the file of most or all of the possible compression paths or combinations of dictionary entries and literals. The backward reference search can include selecting a candidate shortest path based on cost estimates from a cost model. The cost estimates for a given path represent a prediction of the actual cost of the path.

At 210, the system determines if a termination condition has been reached. The termination condition can include performing a predetermined number of iterations. The termination condition can also be based on actual total cost of a candidate path compared to the actual total cost of a previously selected path. For example, the system could terminate the refining when an actual total cost of a path selected during a previous iteration is lower or the same as the actual cost of a current iteration shortest path candidate. When comparing a candidate shortest path cost to the current shortest path selected during a previous iteration, the actual total cost of the path is computed. That is, a candidate shortest path can be selected using the cost model estimates, and, once selected, the actual total cost for that candidate shortest path is computed in order to compare to the actual total cost of the current shortest path. The total cost of a path can include literals, stop code of a block, and prefix codes for copies and lengths. If the actual total cost of the candidate shortest path is lower than that of the path from a previous iteration, the candidate shortest path can be selected as the current shortest path and the system can continue to seek shorter paths (assuming no other termination condition was met). However, if the candidate shortest path has a higher cost (i.e., is less optimal) than the current shortest path, then the system may stop seeking shorter paths and conclude that the current shortest path may represent the shortest possible path and return the current shortest path as the solution. If the termination condition has been reached, processing continues to 212. If not, processing proceeds back to 208 for continued iterative refining.

At 212, the optimized compressed data file can be provided to another system (e.g., a client system), stored in memory or the like.

In an embodiment, 202-212 can be repeated in whole or in part in order to accomplish a contemplated data compression optimization task.

Figure 3:
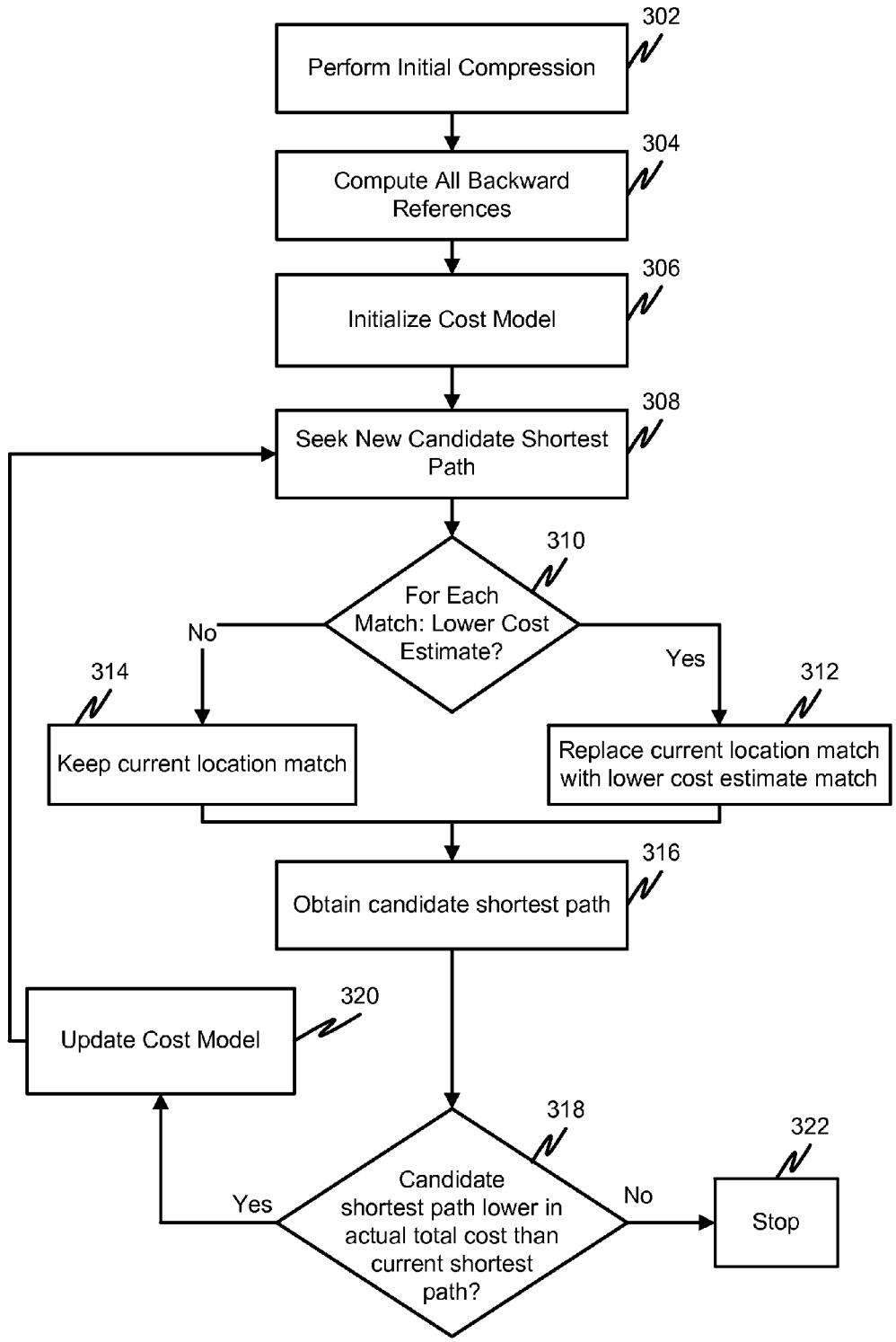
FIG. 3 is a flow chart of an example refinement method for data compression optimization in accordance with at least one embodiment.

FIG. 3 is a flow chart of an example iterative refining process. Processing begins at 302, where the system performs an initial compression and determines a candidate shortest path in a compression file by a greedy method, for example. In an example embodiment, the system uses the greedy method to choose the longest match at each location.

At 304, all possible backward references are determined and stored.

At 306, the cost model is initialized by setting an initial cost for each backward reference. The initial cost determination can include computing an initial entropy coding for references. For example, the Shannon, Huffman or arithmetic entropy coding technique can be applied to the matches determined in 304. The system can also set an initial cost estimate for all possible backward reference matches. The initial cost estimates in the cost model can be a constant value or a constant value with a randomization factor applied. The matches are written to an array including values for cost estimate and match length. Processing continues to 308.

At 308, a new candidate shortest path is selected based on the cost model cost estimates of all matches at each location. Processing continues to 308.

At 308, a new candidate shortest path selection begins. In one embodiment, all possible matches are selected and tested (310). If a newly selected match has a lower cost estimate than the current match, the system can replace the current match with the match having the lower cost estimate (312). If a newly selected match has a higher cost estimate, the system can keep the current location value (314). Other path selection techniques can include filtering (e.g., Kalman filtering or the like), random selection and genetic algorithms. In general, any technique that can be used to select a candidate shortest path can be used in an embodiment.

The cost estimates from the cost model can provide an estimate of the amount of bits that need to be inserted to represent a symbol. For refining purposes, the cost estimates can be represented as a floating point number (or a fixed point number or a fractional bit number), which can help produce a more accurate refinement.

In an example embodiment, the cost estimate can be based on two factors, the backward reference cost and the literal cost. The backward reference cost includes the length of the symbol (e.g., prefix) plus any extra bits, and the distance prefix plus any extra distance bits. The literal cost can include the Shannon entropy of the symbol, or another entropy coding of the symbol such as Huffman or arithmetic.

At 316, once the path selection is complete, a new candidate shortest path is provided and an actual total cost of the candidate shortest path is computed.

At 318, the actual total cost of the candidate shortest path is compared to the actual total cost of the current shortest path. If the actual total cost of the candidate shortest path is lower than the actual total cost of the current shortest path, then processing continues to 320. However, if the actual total bit cost of the current shortest path is lower than the actual total bit cost of the candidate shortest path, then processing continues to 322, where processing ends.

At 320, the cost model is updated based on the actual bit costs from the candidate shortest path. The updating can include averaging the cost estimates from previous iteration (s) with the actual costs from the candidate shortest path. The averaging can incorporate history from other paths and can help make the prediction of a shortest path more robust. The updating of the cost model can be omitted with a possible result being that the system will not achieve as great a compression density. Floating point representation can be used for the cost estimates to provide additional numerical resolution (fixed point and fractional bit numbers can also be used). Processing continues to 308 to continue iterative searching for a better match. In an example embodiment, 302-322 can be repeated in whole or in part in order to accomplish a contemplated data compression refinement task.

Figure 4:
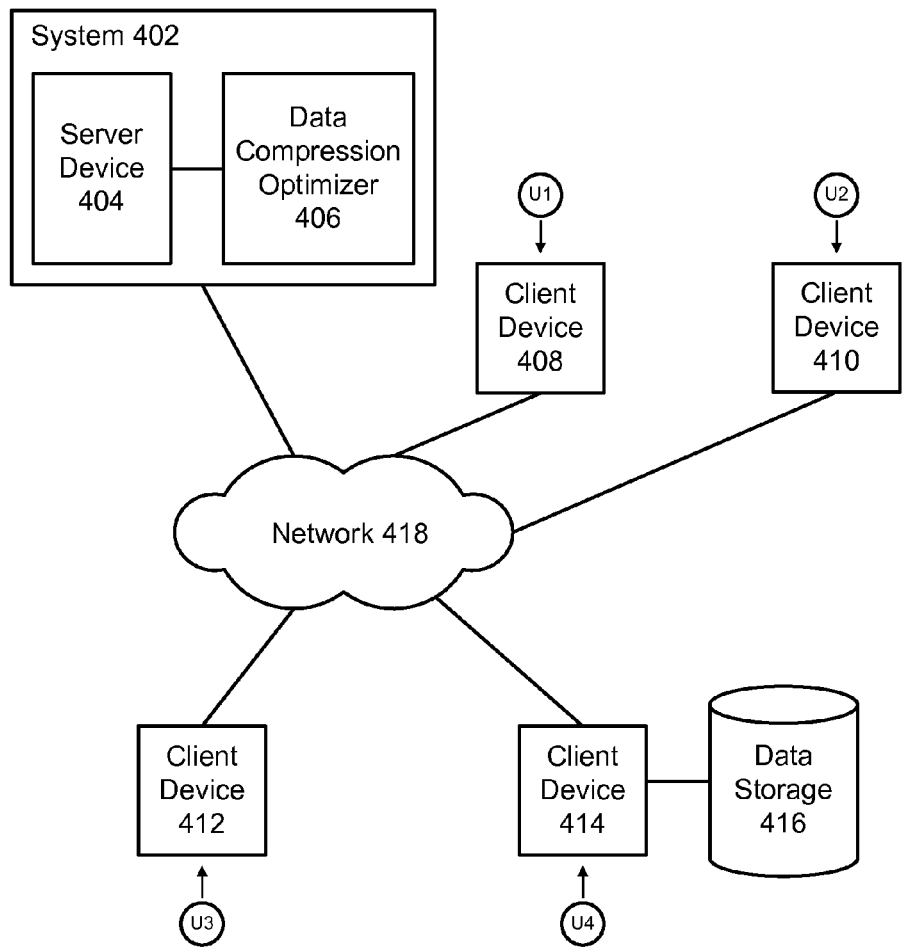
FIG. 4 is a diagram of an example client server system in accordance with at least one embodiment.

FIG. 4 shows an example data compression optimizer in a client server environment 400 that includes a server system 402 having a server device 404 and a data compression optimizer 406. One or more client devices (408-414) can access the server system 402 via a network 418. A client device 414 can have a data storage device 416 attached.

In operation, one or more users (U1-U4) can access the server system 402 via respective client devices (408-414). Users can download files from the server system 402. The files can be stored in the server system 402. The files can be compressed as described herein in order to make additional bandwidth for other uses, such as new members.

Figure 5:
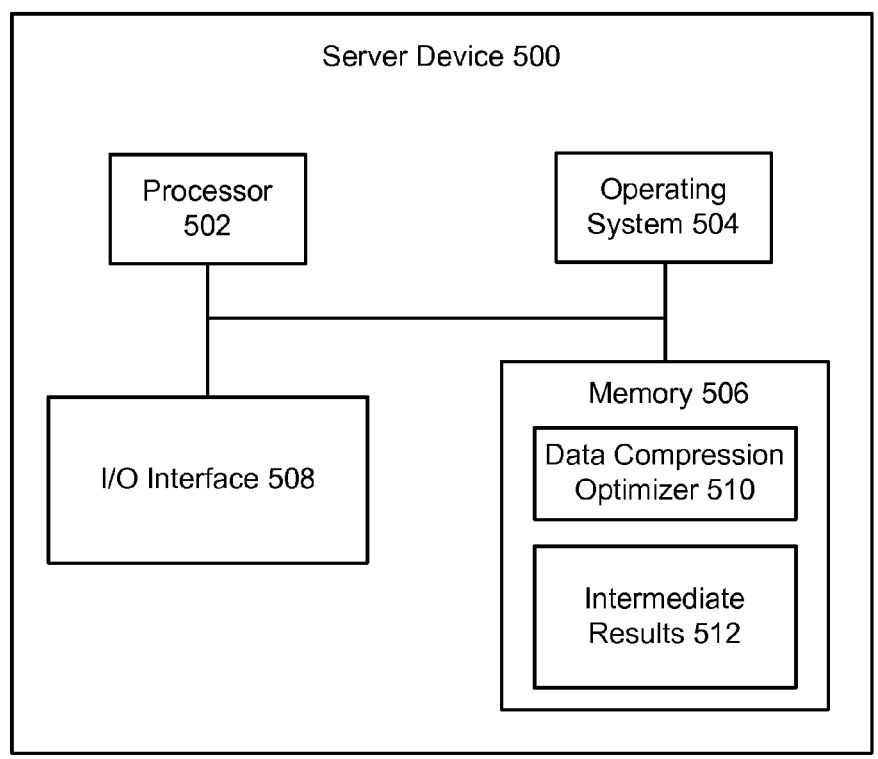
FIG. 5 is a diagram of an example server system in accordance with at least one embodiment.

FIG. 5 is a diagram of an example server device 500 that can be used to optimize data compression in accordance with at least one embodiment. The server device 500 includes a processor 502, an operating system 504, memory 506 and an I/O interface 508. The memory 506 can include a data compression optimizer 510 and a section for intermediate results 512.

In operation, the processor 502 may execute the data compression optimizer 510 stored in the memory 506. The data compression optimizer 510 can include software instructions that, when executed by the processor, cause the processor to perform operations for optimizing data compression in accordance with the present disclosure (e.g., performing one or more of steps 202-212 and/or steps 302-322 described above).

The data compression optimizer 510 can operate in conjunction with the operating system 504 and utilize the intermediate results 512 as described above.

Any system described above can include, but is not limited to, a single processor system, a multi-processor system (co-located or distributed), a cloud computing system, or a combination of the above.

Any client device described above can include, but is not limited to, a desktop computer, a laptop computer, a portable computer, a tablet computing device, a smartphone, a feature phone, a personal digital assistant, a media player, an electronic book reader, an entertainment system of a vehicle or the like.

The network can be a wired or wireless network, and can include, but is not limited to, a WiFi network, a local area network, a wide area network, the Internet, or a combination of the above.

The data storage, memory and/or computer readable medium can include a nontransitory storage device such as a magnetic storage device (hard disk drive or the like), optical storage device (CD, DVD or the like), electronic storage device (RAM, ROM, flash, or the like). The software instructions can also be contained in, and provided as, an electronic signal.

Moreover, embodiments of the disclosed method, system, and computer readable media can be implemented in software executed on a programmed general purpose computer, a special purpose computer, a microprocessor, or the like.

It is, therefore, apparent that there is provided, in accordance with the various embodiments disclosed herein, systems, methods and computer readable media for data compression optimization.

While the invention has been described in conjunction with a number of embodiments, it is evident that many alternatives, modifications and variations would be or are apparent to those of ordinary skill in the applicable arts. Accordingly, Applicants intend to embrace all such alternatives, modifications, equivalents and variations that are within the spirit and scope of the invention.

What is claimed is:

1. A method comprising:
   performing a compression operation on a data file using an LZ77 compressor and Huffman coded entries and literals;
   storing intermediate results of the compression operation in memory;

selecting a hashing technique for accessing the stored intermediate results, wherein the hashing technique is selected based on one or more features of the intermediate results;

iteratively refining the compression operation via backward reference of the stored intermediate results of the compression operation, wherein the refining includes accessing stored intermediate results using the selected hashing technique and selecting one or more entries and literals associated with an increased compression based on cost estimates from a cost model, wherein the cost estimates are represented as floating point numbers; and stopping the refining when a termination condition is reached, the termination condition including one or more of performing a predefined number of iterations, selecting a candidate shortest path having a higher actual total bit cost than a current shortest path, and reaching a steady state of actual total path bit cost.

2. The method of claim 1, further comprising updating the cost model between iterations.

3. A method comprising:

performing a compression operation on a data file using a dictionary coder;

iteratively refining the compression operation via backward reference of intermediate results of the compression operation, wherein the refining includes selecting a candidate shortest path based on cost estimates from a cost model, computing an actual total cost of the candidate shortest path and comparing the actual total cost of the candidate shortest path with an actual total cost of a current shortest path; and stopping the refining when a termination condition is reached.

4. The method of claim 3, wherein the dictionary coder includes an LZ77 compressor having entropy coded entries and literals.

5. The method of claim 3, further comprising selecting a hashing technique for accessing the intermediate results, wherein the hashing technique is selected based on one or more features of the intermediate results.

6. The method of claim 3, wherein the intermediate results are pre-computed and stored in memory and wherein the method further comprises selecting a hashing technique for accessing the stored intermediate results, wherein the hashing technique is selected based on one or more features of the stored intermediate results, and wherein the refining includes accessing stored intermediate results using the selected hashing technique and selecting one or more entries and literals associated with a prediction of increased compression based the cost estimates.

7. The method of claim 3, wherein the refining includes updating the cost estimates in the cost model when a candidate shortest path is selected as a current shortest path.

8. The method of claim 3, wherein the termination condition includes one or more of performing a predefined number of iterations, selecting a candidate shortest path having a higher actual total bit cost than an actual total bit cost of a current shortest path, and/or reaching a steady state of actual total bit cost of selected paths.

9. The method of claim 3, wherein the bit cost estimates are represented as one of floating point numbers, fixed point numbers and fractional bit numbers.

10. The method of claim 3, wherein the intermediate results are pre-computed and stored in memory.

11. A system comprising:

a processor coupled to a computer readable storage medium, the computer readable storage medium having stored therein software instructions that, when executed by the processor, cause the processor to perform operations including:

performing a compression operation on a data file using a dictionary coder;

iteratively refining the compression operation via backward reference of intermediate results of the compression operation, wherein the refining includes selecting a candidate shortest path based on cost estimates from a cost model, computing an actual total cost of the candidate shortest path and comparing the actual total cost of the candidate shortest path with an actual total cost of a current shortest path; and stopping the refining when a termination condition is reached.

12. The system of claim 11, wherein the dictionary coder includes an LZ77 compressor having entropy coded entries and literals.

13. The system of claim 11, wherein the intermediate results are pre-computed and stored in a memory coupled to the processor and wherein the operations further comprise selecting a hashing technique for accessing the intermediate results, wherein the hashing technique is selected based on one or more features of the intermediate results.

14. The system of claim 11, wherein the intermediate results are pre-computed and stored in a memory coupled to the processor, and wherein the operations further comprise selecting a hashing technique for accessing the stored intermediate results, wherein the hashing technique is selected based on one or more features of the stored intermediate results, and wherein the refining includes accessing stored intermediate results using the selected hashing technique and selecting one or more entries and literals associated with an increased compression based on the cost estimates.

15. The system of claim 11, wherein the refining includes updating the cost model when a candidate shortest path is selected as a current shortest path.

16. The system of claim 11, wherein the termination condition includes one or more of performing a predefined number of iterations, selecting a candidate shortest path having a higher actual total bit cost than a current shortest path, and reaching a steady state of actual total path bit cost.

17. The system of claim 11, wherein the cost estimates are represented as one of floating point numbers, fixed point numbers and fractional bit numbers.

18. The system of claim 11, wherein the intermediate results are pre-computed and stored in a memory coupled to the processor.

* * * * *